(12) United States Patent
Barillet et al.

(10) Patent No.: US 7,113,046 B2
(45) Date of Patent: Sep. 26, 2006

(54) APPARATUS FOR SUPPLYING A STANDARD FREQUENCY SIGNAL USING A SIMPLE MICROWAVE SYNTHESIS

(75) Inventors: Roland Barillet, Gif-sur-Yvette (FR); Claude Audoin, Chatenay-Malabry (FR); Frederic Hamouda, Savigny-sur-Orge (FR)

(73) Assignees: Centre National de la Recherche Scientifique (C.N.R.S.), Paris (FR); Centre National d'Etudes Spatiales, Paris (FR)

( * ) Notice: Subject to any disclaimer, the term of this patent is extended or adjusted under 35 U.S.C. 154(b) by 0 days.

(21) Appl. No.: 10/481,116

(22) PCT Filed: Jun. 18, 2002

(86) PCT No.: PCT/FR02/02104

§ 371 (c)(1),
(2), (4) Date: Jun. 7, 2004

(87) PCT Pub. No.: WO02/103913

PCT Pub. Date: Dec. 27, 2002

(65) Prior Publication Data

US 2004/0232994 A1   Nov. 25, 2004

(30) Foreign Application Priority Data

Jun. 18, 2001   (FR)   .................................. 01 07982

(51) Int. Cl.
*H03L 7/087* (2006.01)
(52) U.S. Cl. .............................. 331/2; 331/94.1; 331/3
(58) Field of Classification Search .................... 331/3, 331/94.1, 2
See application file for complete search history.

(56) References Cited

U.S. PATENT DOCUMENTS 5,148,122 A   9/1992   Karlquist ........................ 331/3

OTHER PUBLICATIONS

Patent Abstracts of Japan, vol. 1999, No. 12, Oct. 29, 1999—& JP 11 205138 A (NEC Miyagi Ltd; NEC Corp), Jul. 30, 1999 abstract.

(Continued)

*Primary Examiner*—Joseph Chang
(74) *Attorney, Agent, or Firm*—Young & Thompson

(57) ABSTRACT

The invention relates to a device (1) for producing a reference frequency signal (Se) from the response of an atomic resonator (R) to a pumping signal (Fat) transmitted thereto, comprising: a first oscillator for production of a first signal (S1) of frequency (F0) as a function of the response signal (E1) from the resonator (R); a second oscillator (13) for production of a second signal (S2) at a frequency (NF0) which is equal to a whole multiple of that of the first signal (S1). According to the invention, the second oscillator is selected to produce a second signal (S2) close in frequency to the frequency of resonance for the resonator (R).

12 Claims, 1 Drawing Sheet

OTHER PUBLICATIONS

Barillet R et al: Limitation of the Clock Frequency Stability by the Interrogation Frequency Noise: Experimental Results: IEEE Transactions on Instrumentation and Measurement, IEEE Inc. New York, US, vol. 42, No. 2, Apr. 1, 1993, pp. 276-280, XP000387467 ISSN: 0018-9456, p. 276, col. 2, line 13-p. 277, col. 2, line 6; figure 1.

Koga Y et al.:"A Microwave Exciter for CS Frequency Standards Based on a Sapphire-Loaded Cavity Oscillator" IEEE Transactions on Ultrasonics, Ferroelectrics and Frequency Control, IEEE Inc. New York, US. vol. 48, No. 1, Jan. 2001, pp. 1-5, XP001050962 ISSN: 0885-3010 p. 1, col. 2, paragraph II-p. 2, col. 2, last line; figures 1,3.

Gupta A S et al: "Cs frequency synthesis: a new approach" Proceedings of the 1999 Joint Meeting of the European Frequency and Time Forum and the IEEE International Frequency Control Symposium, vol. 2, 1999, pp. 615-619, XP010377731 cited in the application p. 615, col. 2, line 18, p. 616, col. 1, line 22; figure 1.

Karlquist R K: "A New RF Architecture for Cesium Frequency Standards" Proceedings of the Frequency Control Symposium. Hershey, May 27-29, 1992, New York, IEEE, US, May 27, 1992, pp. 134-142, XP000341347 ISBN: 0-7803-0476-4 cited in the application p. 137, col. 1, line 43-p. 139, col. 1, line 2; figures 3, 4.

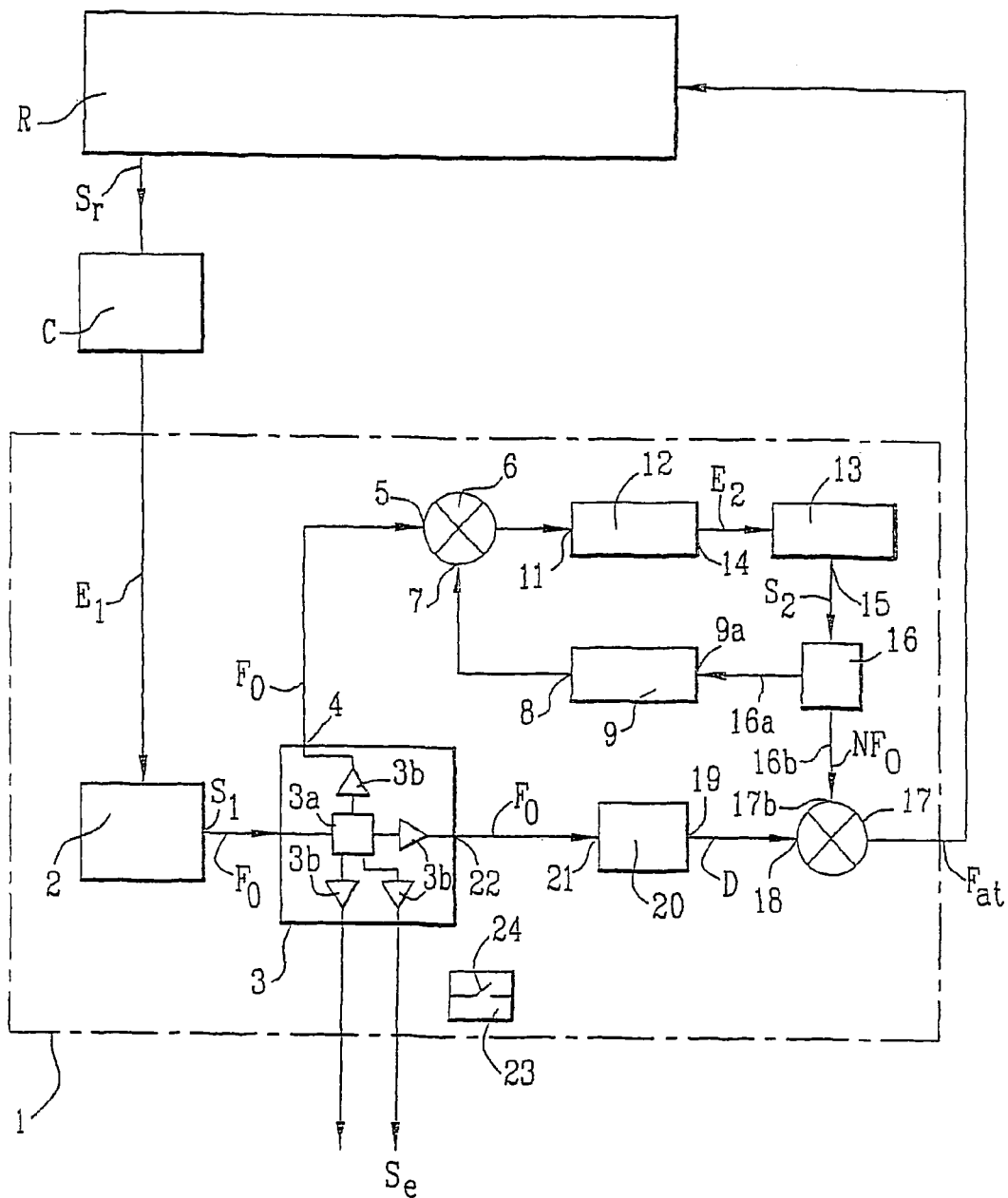

APPARATUS FOR SUPPLYING A STANDARD FREQUENCY SIGNAL USING A SIMPLE MICROWAVE SYNTHESIS

The present invention relates to apparatus for supplying a standard frequency signal on the basis of the response of an atomic resonator to a driver signal which is applied thereto.

BACKGROUND OF THE INVENTION

Atomic resonators, e.g. cesium resonators, are used because of the precision of their atomic transition defining a standard frequency that is exact and very stable. In apparatus designed for this purpose, a driver signal is synthesized at the resonant frequency of the resonator, it is delivered in modulated form to the resonator, and the response signal of the resonator is picked up and demodulated, with the frequency of a first oscillator then being servo-controlled on the basis of the demodulated signal. Such apparatus enables a standard signal to be generated having frequency which is very exact and very stable, to within about $10^{-12}$ and $10^{-14}$, respectively.

Such apparatuses are required, for example, in space applications, for navigation by satellite.

U.S. Pat. No. 5,148,122 describes apparatus of the kind described above, for a cesium resonator comprising:

a first oscillator at 10 megahertz (MHz) suitable for producing a first signal at a frequency which is a function of the response signal from the resonator;

a second oscillator producing a second signal at 650 MHz as a function of a control signal;

means for servo-controlling the phase of the second signal on the first signal, producing the control signal; and means for generating the reference signal and the driver signal downstream from the second oscillator, which means include frequency dividers and multipliers.

That apparatus turns out to present drawbacks. It requires a large number of component elements, thereby making it complex, heavy, and voluminous. It consumes a large quantity of energy and it is expensive.

The document entitled "A new RF architecture for cesium frequency standards", published in pp. 134 to 142 of 1992 IEEE Frequency Control Symposium, discloses similar apparatus further comprising a third oscillator downstream from the multiplier and divider circuit and producing the driver signal at the resonant frequency.

Of even greater complexity, that apparatus additionally creates disturbance by electromagnetic radiation, and the atomic resonator is sensitive thereto, because an oscillator is being used at its resonant frequency. Overcoming such disturbance requires shielding, which is expensive, heavy, and bulky.

The document entitled "Cs frequency synthesis: a new approach", published on pp. 615 to 619 of Volume 2 of 1999 Joint Meeting EFTF—IEEE IFCS, describes a cesium resonator frequency synthesizer having oscillators at 5 MHz, 100 MHz, and 6.4 gigahertz (GHz). An analog regenerator divider responds to the oscillator at 6.4 GHz to generate signals at 3.2 GHz and 9.6 GHz. A signal at 9.192 GHz for the cesium resonator is generated after mixing a signal at 407.368 MHz with the signal at 9.6 GHz.

That synthesizer likewise comprises a large number of circuits including an analog regenerator divider which must be made specially for the synthesizer.

OBJECTS AND SUMMARY OF THE INVENTION

The invention seeks to provide apparatus mitigating the drawbacks of the prior art, that is simple in structure, comprising only conventional commercially-available circuits, and only a relatively small number thereof.

To this end, the invention provides apparatus for delivering a standard frequency signal on the basis of the response of an atomic resonator to a driver signal which is applied thereto, the apparatus comprising:

a first oscillator suitable for producing a first signal of frequency that is a function of the response signal of the resonator;

a second oscillator suitable for producing a second signal of frequency equal to an integer multiple of the frequency of the first signal, as a function of a control signal;

phase servo-control means for servo-controlling the phase of the second signal on the first signal, thereby producing the control signal; and means for generating the driver signal from the second signal;

the apparatus further comprising means for directly delivering at least one standard signal from the first signal and connected downstream from the first oscillator and upstream from the second oscillator, and the second oscillator is selected in such a manner as to produce a second signal of frequency equal to a value lying in a range of 1 GHz on either side of the resonant frequency of the resonator.

The invention makes it possible to omit the frequency multiplier and divider circuits downstream from the second oscillator for generating the standard signal and the driver signal.

According to a characteristic of the invention, the second oscillator is selected to produce a second signal of frequency substantially equal to one of the twenty integer multiples of the first signal that are closest to the resonant frequency of the resonator.

According to other characteristics of the invention, enabling the structure of the apparatus to be further simplified:

the second oscillator is selected in such a manner as to produce a second signal of frequency lying in a range of 50 MHz on either side of the resonant frequency of the resonator; and the second oscillator is selected in such a manner as to produce a second signal of frequency substantially equal to one of the two integer multiples of the frequency of the first signal that are closest to the resonant frequency of the resonator.

According to a characteristic that enables good phase coherence to be obtained between the first and second signals, the phase servo-control means comprise a logical frequency divider circuit for dividing the second signal by the integer multiple, a phase comparator circuit for comparing the phase of the first signal with the phase at the output of the circuit for dividing the second signal, and a circuit for generating a control signal for the second oscillator from the signal output by the comparator circuit.

According to another characteristic of the invention, making it possible both to dispense with multipliers for generating the driver signal and to avoid the second oscillator disturbing the resonator, the second oscillator is selected in such a manner as to produce a second signal at a frequency that is offset relative to the resonant frequency of the resonator, the generator means comprising, downstream from the second oscillator, a circuit suitable for adding and/or subtracting an offset signal to or from the second signal so as to deliver the driver signal, and a circuit for delivering the offset signal. This makes it possible to adjust the power of the driver signal delivered to the resonator via the frequency adder and/or subtracter circuit to deliver just enough power to the resonator. In addition, any fluctuation in the power of the second signal does not significantly modify the power of the driver signal, which can be controlled proportionally by the offsetting circuit. This avoids any problems of aging in the second oscillator.

In an embodiment, the adder and/or subtracter circuit is constituted by a mixer circuit, e.g. a single-sideband circuit.

In an embodiment, the circuit for delivering the offset signal comprises a frequency synthesizer synchronized on the first signal.

According to a characteristic of the invention, the means for generating the driver signal comprise, downstream from the second oscillator, only circuits for adding and/or subtracting frequency to or from the second signal.

In an embodiment of the invention, suitable for generating standard frequency signals from the response of a cesium atomic resonator, the second oscillator is suitable for producing a second signal at 9200 MHz, and the first oscillator is suitable for delivering a first signal at 10 MHz.

According to a characteristic of the invention, the apparatus comprises, as oscillators, only the first and second oscillators.

BRIEF DESCRIPTION OF THE DRAWING

The invention will be better understood in the light of the following description made with reference to the drawing given purely by way of example and constituting a diagram of apparatus in accordance with the invention for supplying a standard frequency.

MORE DETAILED DESCRIPTION

The apparatus 1 for supplying a standard frequency is described with reference to a cesium resonator R. Naturally, the apparatus could equally well be used with any other atomic resonator, for example a rubidium resonator.

The apparatus 1 for supplying a standard frequency comprises a first oscillator 2 outputting a first signal S1 of determined frequency F0 adjusted by an adjustment signal received on an adjustment input E1. The first oscillator 2 is of the voltage controlled crystal oscillator (VCXO) type, for example, and operates at 10 MHz, for example. The adjustment input E1 is connected to a monitor circuit C which delivers an adjustment signal as a function of the response signal Sr from the resonator R. For a description of the operation of the resonator R and the monitor circuit C, reference can be made to U.S. Pat. No. 5,148,122 where these elements are designated respectively by references 26 and 11 and where the corresponding description is given from column 3, line 47 to column 4, line 51.

The output from the first oscillator 2 is connected to a circuit 3 for distributing the first signal S1 and for supplying the standard signal Se. Naturally, a plurality of standard signals can be supplied by the circuit 3. Standard signals at frequencies which are submultiples of the frequency of the standard signal Se at 10 MHz may also be supplied by appropriate circuits situated downstream from the signal Se and the delivery circuit 3. The circuit 3 comprises a circuit 3a for sharing the power delivered by the first signal S1, with each of its outputs connected to a respective broadband isolating amplifier 3b of low gain outputting a respective signal at frequency F0. One or more isolator amplifiers 3b output the standard signal Se at the same frequency F0. An output 4 of another isolation amplifier 3b of the distribution and delivery circuit 3 is connected to a first input 5 of a phase comparator whose second input 7 is connected to the output 8 of a broadband logical frequency divider 9. The output 10 from the phase comparator is connected to the input 11 of a circuit 12 for generating the control signal of a second oscillator 13 operating at microwave frequency. The frequency divider 9 can be implemented as a plurality of divider stages in cascade.

The output 14 from the control signal generator circuit 12 is connected to a control input E2 of the second oscillator 13 whose output 15 delivers a second signal S2 of determined frequency as a function of the signal present on its control input E2. The second signal S2 is situated at a frequency that is within 1 GHz above or below the resonant frequency of the resonator R. The frequency of the second signal is an integer multiple N of the frequency F0 of the first signal S1. The second signal S2 is at a frequency close to and different from the resonant frequency of the resonator R and is at a frequency equal to one of the twenty integer multiples of the frequency of the first signal S1 that are closest to the resonant frequency, and for example one of the two integer multiples of the frequency of the first signal S1 that are closest to the resonant frequency. In the embodiment shown, the frequency of the second signal S2 produced by the second oscillator is 9200 MHz for a cesium resonator having a resonant frequency of 9,192,631,700 hertz (Hz).

The output 15 of the second oscillator 13 is applied to a coupler 16 connected via a first output 16a to the input 9a of the frequency divider 9 whose division ratio is equal to the above-mentioned integer multiple N. The signal present on the output 8 of the divider 9 possesses a fundamental frequency equal to the frequency F0 of the first signal. The control signal generator circuit 12, the divider 9, and the comparator 6 are such as to form a circuit for locking the phase of the second signal S2 on the first signal S1.

A second output 16b of the coupler 16 is connected to a first input 17b of a frequency mixer circuit 17 whose second input 18 receives a frequency offset signal D and whose output delivers a signal Fat for driving the atomic resonator R and having its resonant frequency. The mixer circuit 17 adds and/or subtracts the frequency of the offset signal D to or from the second signal S2. The offset signal D is frequency modulated by a signal at very low frequency, for example several tens of hertz, and is produced at the output 19 of a delivery circuit 20. In the example above, the circuit 20 delivers the offset signal D at 7.368230 MHz. The delivery circuit 20 is formed, for example, by a low frequency direct digital synthesizer (DDS) type circuit. The delivery circuit 20 is synchronized via its synchronization input 21 which is connected to an output 22 of the distribution circuit 3.

In an embodiment enabling a less expensive circuit to be used, the mixer circuit 17 delivers two sidebands and outputs a frequency sum signal and a frequency difference signal based on the second signal S2 and the offset signal D, and in the above example these are at frequencies of 9,207.368230 MHz and 9,192.631770 MHz respectively.

In an embodiment avoiding the interference effects produced by the output signal at 9,207.368230 MHz so as to obtain better frequency exactness and stability, the mixer circuit 17 is a single-sideband circuit selected to conserve at its output the driver signal Fat at the resonant frequency while attenuating the signal at the frequency of 9,207.368230 MHz.

The apparatus 1 also comprises an electricity power supply 23 for its various components. The apparatus 1 may be switched on directly by actuating a switch 24 provided on the power supply, without requiring adjustment.

The first and second oscillators 2 and 13 respectively can be selected in a higher performance version to obtain frequency exactness and stability of about $10^{-12}$ and $10^{-14}$ respectively, or in a less expensive lower performance version to obtain exactness and stability of about $10^{-11}$ and $10^{-13}$, respectively.

What is claimed is:

1. An apparatus for delivering a standard frequency signal based on a response of an atomic resonator to a driver signal applied thereto, the apparatus comprising:
    a first oscillator for producing a first signal of a frequency that is a function of a response signal from the atomic resonator;
    a second oscillator for producing a second signal of a frequency equal to an integer multiple of the frequency of the first signal, as a function of a control signal;
    phase servo-control means for servo-controlling a phase of the second signal on the first signal, thereby producing the control signal;
    generator means for generating the driver signal of the atomic resonator from the second signal; and
    delivery means for directly delivering at least one standard frequency signal from the first signal,
    wherein said phase servo-control means includes a logical frequency divider circuit that divides the second signal by the integer multiple, a phase comparator circuit that compares the phase of the first signal to the phase of an output from said logical frequency divider circuit, and a control signal generator circuit that generates the control signal for said second oscillator from an output from said phase comparator circuit.

2. The apparatus according to claim 1, wherein the frequency of the second signal is substantially equal to one of the twenty integer multiples of the frequency of the first signal that are closest to the resonant frequency of the atomic resonator.

3. The apparatus according to claim 1, wherein the frequency of the second signal is in a range of 50 MHz on either side of the resonant frequency of the atomic resonator.

4. The apparatus according to claim 1, wherein the frequency of the second signal is substantially equal to one of the two integer multiples of the frequency of the first signal that are closest to the resonant frequency of the atomic resonator.

5. The apparatus according to claim 1, wherein the frequency of the second signal is offset relative to the resonant frequency of the atomic resonator.

6. The apparatus according to claim 1, wherein said generator means comprises, downstream from said second oscillator, a first circuit that adds and/or subtracts a frequency offset signal to or from the second signal so as to deliver the driver signal of the atomic resonator, and a second circuit for delivering the frequency offset signal that is adapted to control proportionally the power of the driver signal of the atomic resonator.

7. The apparatus according to claim 6, wherein said first circuit comprises a mixer circuit.

8. The apparatus according to claim 6, wherein said second circuit comprises a frequency synthesizer synchronized on the first signal.

9. The apparatus according to claim 6, wherein said generator means comprises, downstream from said second oscillator, only ones of said first circuit.

10. The apparatus according to claim 1, wherein the frequency of the second signal is about 9200 MHz and the frequency of the first signal is about 10 MHz.

11. The apparatus according to claim 1, comprising, as oscillators, only said first and second oscillators.

12. The apparatus according to claim 1, wherein said delivery means is connected downstream from said first oscillator and upstream of said second oscillator, and wherein the frequency of the second signal is within 1 GHz of the resonant frequency of the atomic resonator.

* * * * *